United States Patent
Haase et al.

(10) Patent No.: US 12,119,400 B2
(45) Date of Patent: Oct. 15, 2024

(54) SEMICONDUCTOR TRANSISTOR DEVICE AND METHOD OF MANUFACTURING THE SAME

(71) Applicant: Infineon Technologies Austria AG, Villach (AT)

(72) Inventors: Robert Paul Haase, San Pedro, CA (US); Jyotshna Bhandari, Villach (AT); Heimo Hofer, Bodensdorf (AT); Ling Ma, Redondo Beach, CA (US); Ashita Mirchandani, Torrance, CA (US); Harsh Naik, El Segundo, CA (US); Martin Poelzl, Ossiach (AT); Martin Henning Vielemeyer, Villach (AT); Britta Wutte, Feistritz (AT)

(73) Assignee: Infineon Technologies Austria AG, Villach (AT)

( * ) Notice: Subject to any disclaimer, the term of this patent is extended or adjusted under 35 U.S.C. 154(b) by 108 days.

(21) Appl. No.: 17/714,660

(22) Filed: Apr. 6, 2022

(65) Prior Publication Data

US 2022/0231163 A1    Jul. 21, 2022

Related U.S. Application Data

(62) Division of application No. 16/717,445, filed on Dec. 17, 2019, now Pat. No. 11,316,043.

(30) Foreign Application Priority Data

Dec. 20, 2018   (EP) .................................... 18214802

(51) Int. Cl.
*H01L 29/78*     (2006.01)
*H01L 29/423*    (2006.01)
(Continued)

(52) U.S. Cl.
CPC ...... *H01L 29/7813* (2013.01); *H01L 29/4236* (2013.01); *H01L 29/456* (2013.01); *H01L 29/66734* (2013.01)

(58) Field of Classification Search
CPC ............. H01L 29/7813; H01L 29/4236; H01L 29/456; H01L 29/66734; H01L 29/407;
(Continued)

(56) References Cited

U.S. PATENT DOCUMENTS 6,849,899 B2   2/2005   Hshieh et al.
7,005,351 B2   2/2006   Henninger et al.
(Continued)

FOREIGN PATENT DOCUMENTS

DE    10355669 A1    6/2005
JP    2001284587 A   10/2001

*Primary Examiner* — Dale E Page
*Assistant Examiner* — Quovaunda Jefferson
(74) *Attorney, Agent, or Firm* — Murphy, Bilak & Homiller, PLLC

(57) ABSTRACT

A method for manufacturing a semiconductor transistor device includes etching a vertical gate trench into a silicon region, depositing a silicon gate material on an interlayer dielectric formed in the vertical gate trench so that an upper side of the interlayer dielectric is covered, etching through the silicon gate material in the vertical gate trench to partly uncover the upper side of the interlayer dielectric and so that a silicon gate region of a gate electrode of the semiconductor transistor device remains in the vertical gate trench, and depositing a metal material into the vertical gate trench so that the partly uncovered upper side of the interlayer dielectric is covered by the metal material.

10 Claims, 9 Drawing Sheets

(51) Int. Cl.
*H01L 29/45* (2006.01)
*H01L 29/66* (2006.01)

(58) Field of Classification Search
CPC ........... H01L 29/41766; H01L 29/4925; H01L 29/4933; H01L 29/4983; H01L 29/66727; H01L 29/78; H01L 1037/42356; H01L 1037/42364; H01L 1037/66477
See application file for complete search history.

(56) References Cited

U.S. PATENT DOCUMENTS

| | | |
|---|---|---|
| 2006/0197148 A1 | 9/2006 | Hsu |
| 2010/0044785 A1* | 2/2010 | Murphy ............ H01L 29/66734 |
| | | 438/270 |
| 2012/0025874 A1 | 2/2012 | Saikaku et al. |
| 2016/0133742 A1 | 5/2016 | Okuda et al. |
| 2016/0365441 A1 | 12/2016 | Siemieniec et al. |

* cited by examiner

SEMICONDUCTOR TRANSISTOR DEVICE AND METHOD OF MANUFACTURING THE SAME

RELATED APPLICATIONS

The instant application is a divisional of and claims priority to U.S. application Ser. No. 16/717,445 filed on Dec. 17, 2019, which in turn claims priority to European Patent Office Application 18214802.3 filed on Dec. 20, 2018, the content of each application being incorporated by reference herein in their entirety.

TECHNICAL FIELD

The present invention relates to a semiconductor transistor device with a vertical gate trench.

BACKGROUND

In a vertical power field effect transistor, the gate electrode is disposed in a gate trench etched into the silicon. Laterally aside the gate electrode, isolated therefrom by a gate dielectric, the channel region is arranged. It extends vertically between the source and the drain region. By applying a voltage to the gate electrode, the channel path formation in the channel region can be controlled. Typically, polycrystalline silicon (polysilicon) is used as a gate electrode material. It is electrically conductive and enables a small work function difference between the gate electrode and the channel region. Likewise, the threshold voltage of the transistor is kept low.

SUMMARY

It is an object of the present invention to provide a vertical transistor device with improved device characteristics, as well as a method of manufacturing such a device.

In the gate electrode of a device according to the invention, different materials are combined. It comprises a silicon gate region made of a conductive silicon gate material and a metal inlay region made of a metal material. These regions are arranged such that the silicon gate region forms at least a section of a sidewall of the gate electrode, and that the metal inlay region extends up from a lower end of the gate electrode.

The sidewall of the gate electrode, which is formed by the silicon gate material in at least a section, lies laterally aside the channel region (isolated therefrom by the gate dielectric arranged laterally in between). Depending on the design in detail, the silicon gate material at this interface can enable or retain a small work function difference and a low threshold voltage, thus. At the same time, the metal inlay region can reduce the resistance $R_G$ of the gate electrode. This can enhance the gate signal propagation across the device and enable higher switching frequencies. In this respect, the extension of the metal inlay region down to the lower end of the gate electrode can allow for an increased cross-section of the metal inlay, resulting in a lower $R_G$. This can for instance be an advantage in comparison to placing a metal liner simply on top of the silicon gate region.

In general words, an idea of the invention is to provide a gate electrode, which has a work function adapted material aside the channel region (with the interlayer dielectric in between) and a low resistance material inside the electrode, in particular at the bottom thereof. The work function adapted material can form either the whole sidewall of the gate electrode or only an upper section thereof, see in detail below. Thus, depending on the design, the metal inlay region can even form a lower section of the sidewall of the gate electrode aside the channel region. In this case, the work function of the metal can be used for a defined threshold voltage tuning, namely to locally increase the threshold voltage, for instance to counteract drain induced barrier lowering.

Preferred embodiments and features are provided in this description and in the dependent claims. Therein, the individual features shall be disclosed independently of a specific claim category, the disclosure relates to apparatus and device aspects, but also to method and use aspects. If for instance a device manufactured in a specific way is described, this is also a disclosure of a respective manufacturing process, and vice versa.

Seen in a sectional view, the gate electrode can preferably have a symmetrical design in the gate trench (the sectional plane lies perpendicular to a lateral length extension of the trench). Then, at a second sidewall of the gate electrode, which lies laterally opposite to the first sidewall at the first channel region, a second channel region is arranged. In this sectional view, the metal inlay region can intersect the silicon gate region vertically, namely divide the silicon gate region into two parts. Therein, at each of the opposite sidewalls, one part of the silicon gate region is arranged, namely a first silicon gate region part at the first sidewall and a second silicon gate region part at the second sidewall. Laterally between the silicon gate region parts, the metal inlay region is arranged.

Across the device, a plurality of gate trenches can be provided, forming for instance a strip-like structure with parallel trenches, or a net structure with transverse trenches. An electrical contact (metal bond pad) can for instance be provided at a side or corner of the device. Referring to the active area of the device as a whole, the gate electrode design according to the invention can for instance be implemented in at least 30%, 50% or 70% of this area, preferably it is implemented over the whole active area (100%). The time delay in gate signal propagation gets more critical, the smaller the devices become in terms of scaling (semiconductor technology shrinkage). The shrinkage reduces the gate electrode width, which results in an increased $R_G$.

A preferred silicon gate material can be doped polycrystalline silicon (polysilicon), for instance n-doped polysilicon or p-doped polysilicon. Alternatively, for instance amorphous silicon could be used. Both materials enable or retain a small work function difference. The metal material of the metal inlay region can for example be or comprise tungsten, in particular as a bulk material, deposited for instance by Chemical Vapor Deposition (CVD). The metal material can also be or comprise a silicide or silicide formation layer, for instance titanium silicide or titanium. Further, it can be or comprise a barrier layer, for example titanium nitride (TiN), in particular Ti/TiN. As a whole, the metal inlay can for instance be composed of an outer layer or layer sequence (silicide/silicide formation layer and barrier layer) and a bulk material, for example tungsten. The barrier layer can be arranged between the silicide/silicide formation layer and the bulk material. In particular, the material sequence from a contact surface, where the metal inlay contacts the silicon gate material, into the metal inlay can be: titanium silicide, Ti/TiN, followed by tungsten as bulk material.

For the work function difference discussed above, the gate electrode material aside the channel region, adjacent to the gate dielectric is important. Therefore, the "sidewall" of the gate electrode, as referred to in this application, extends vertically from a lower end of the channel region to an upper end thereof. As a whole, the gate electrode can extend deeper into the gate trench (see FIG. 4 for illustration) or further upward than the channel region (see FIGS. 3*a*,*b* for instance). However, those sections of a lateral wall of the gate electrode, which lie vertically above the upper end and below the lower end of the channel region, are not considered as a "sidewall" of the gate electrode in the sense of this application (any section above or below the channel region does not lie laterally aside the latter).

The "gate electrode" is the electrically conductive part of the gate region, it is electrically isolated from the channel region by the gate dielectric (in particular gate oxide, for instance silicon oxide). Thus, the gate dielectric is arranged laterally in between the channel region and the gate electrode. In other words, one lateral side of the gate dielectric lies laterally adjacent to the channel region, and the opposite lateral side of the gate dielectric lies laterally adjacent to the gate electrode. The channel region extends vertically along the gate dielectric. In particular, the gate dielectric can be arranged inside the gate trench and form a sidewall thereof. Then, the channel region can extend vertically along this sidewall of the gate trench (the channel region lies outside the gate trench).

The "vertical" direction lies perpendicular to a surface of a layer of the device, for instance a surface of the silicon substrate and/or a surface of an epitaxial layer (deposited on the substrate) and/or a surface of the interlayer dielectric, on which the frontside metallization is deposited, and/or a surface of the frontside metallization itself. The horizontal/lateral directions lie perpendicular to the vertical direction, the device/chip area is for instance taken laterally/horizontally. "Upper" and "lower" refer to the vertical direction, the vertical trench extends from an upper surface down into the silicon material towards a lower end. At the frontside of the device, above the source/drain/channel region, a frontside metallization can be provided, for instance a combined source/body contact (the channel region is formed in the body region). The drain contact can be provided at the backside of the device. Alternatively, the drain connection can be routed from the bottom of the drift region to the frontside of the device by vertical conduction, for instance via an $n^+$-sinker. In this case, a separate frontside metal contact will be provided.

Between the channel region and the drain region, the device can comprise a drift region having the same majority charge carriers as the drain region, but a lower doping. Preferably, the drain region is formed in the silicon substrate, and the drift/channel/source regions are grown epitaxially on this substrate (channel and source can particularly be formed by ion implantation, see below). As a power device, the transistor can for instance have a breakdown voltage of at least 10 V, 20 V, 30 V or 40 V, with possible upper limits of for instance not more than 800 V, 600 V, 400 V or 200 V. The transistor is preferably an enhancement-type device. In general, it could be a p-channel device, even though an n-channel device is preferred. In this case, the source and the drain region are highly n-doped, the drift region is lightly n-doped, and the channel region is formed in a p-doped body region.

In a preferred embodiment, the whole sidewall of the gate electrode aside the channel region is formed by the silicon gate material, for instance polysilicon. This retains the existing work function difference compared to a conventional polysilicon gate, while the metal inlay region reduces $R_G$, see above. Preferably, the metal inlay region covers an inner sidewall of the silicon gate region completely. This inner sidewall faces away from the channel region. In case of the symmetrical design described above, the silicon gate region has two inner sidewalls facing each other laterally (the metal inlay region extends vertically through in between).

Preferably, the metal inlay region extends further upwards than the silicon gate region. Likewise, the cross-section of the metal inlay can be increased so that $R_G$ is lowered. When manufacturing the device, the metal inlay material is deposited into a "metal inlay region trench" formed when the silicon gate material is etched through. In this stage, the gate trench has been filled up before, at least partly by depositing the silicon gate material. Preferably, an interlayer dielectric, for instance silicon dioxide, is deposited on top of the silicon gate material and fills up the gate trench completely. In this case, the metal inlay region trench etched thereafter will extend vertically through the interlayer dielectric and the silicon gate material below. Into this trench, the metal material of the metal inlay region is deposited, preferably it fills up the trench completely (at least temporarily during manufacturing).

In a preferred embodiment, a metal material filler for contacting the source region is simultaneously deposited into a vertical contact trench extending into the source region. Thereafter, both trenches are filled up by metal. From the surface of the device, excess metal can be removed, for instance by chemical mechanical polishing (CMP). To obtain a device as shown in FIGS. 1,3*a*, the metal inlay region can be etched back, wherein the metal material filler in the contact trench can be protected, for instance by a photoresist. Alternatively, both trenches can remain filled up completely, see FIG. 3*b* for illustration.

Preferably, a lower end of the gate electrode lies vertically below a lower end of the channel region. In other words, the silicon gate region and/or the metal inlay region extend(s) deeper than the channel region. Preferably, the metal inlay region extends deeper than the silicon gate region, namely through the silicon gate region and further downwards. Consequently, the gate electrode has a smaller lateral width below the channel region (defined by the metal inlay region) than aside the channel region (defined by silicon gate region and metal inlay region). Since the lateral width of the gate electrode is smaller below the channel region, the lateral width of the interlayer dielectric is respectively larger there. This can reduce a capacitance between gate and drain (or gate and source), which could otherwise impair the performance. To manufacture such a device, an additional anisotropic dielectric etch can be applied after etching back the silicon gate material. Likewise, the metal inlay region trench is etched deeper, an additional groove is added below the silicon gate material. This groove is filled up by metal, what can maximize the cross-section (without causing a source/gate capacitance, see below).

In a preferred embodiment, the metal material filler of the contact trench extends further upwards than the metal inlay region of the gate electrode. For manufacturing such a device, the metal deposited into the metal inlay region trench as described above can be etched back, for instance until its upper end lies substantially on the same height as the upper end of the silicon gate region. Alternatively, it can lie between the upper end of the silicon gate region and the upper end of the metal material filler. Such a design can reduce a capacitive coupling between the metal material filler and the metal inlay region, namely between source and gate. After etching back the metal in the metal inlay region trench, the latter can be filled up by an interlayer dielectric covering the gate electrode, for instance silicon oxide.

In the embodiments of the paragraphs above, the silicon gate region formed the whole sidewall of the gate electrode aside the channel region. In an alternatively preferred embodiment, it forms only an upper section of the sidewall, wherein the metal inlay region forms a lower section thereof. Preferably, the lower section extends over not more than ⅓ of the sidewall, particularly preferred over not more than ¼ of the sidewall. Lower limits can for instance be ¹/₁₀ or ⅛. With this device, the work function of the metal material at the bottom of the channel is used to increase the transistor threshold voltage locally. This can counteract a breakdown mechanism known as drain induced barrier lowering, which gets more critical with decreasing channel length.

To manufacture such a device, the metal of the metal inlay region can be deposited prior to the deposition of the silicon gate material. After etching the gate trench and forming the gate oxide, for instance by deposition or thermal oxidation, the metal inlay material is deposited. It can for instance be deposited in excess and etched back to adjust the desired height of the lower section of the sidewall formed by the metal material. Then, the silicon gate material is deposited on top of the metal inlay region.

The following embodiments apply for both alternatives, for the sidewall formed by the silicon gate material as a whole and also for the sidewall formed by the metal material in the lower section.

As discussed already, the metal material filler in the contact trench is preferably made of the same metal material as the metal inlay region. This applies at least for the bulk material which is preferably tungsten. The filler and the inlay are preferably deposited at the same time, namely in the same process step, which can reduce the overall number of process steps.

In a preferred embodiment, the metal inlay region comprises a silicide layer and is in electrical contact with the silicon gate region at or via this silicide layer. Further, as mentioned above, the metal inlay can comprise a barrier layer, in particular titanium nitride, between the silicide layer and the bulk material of the metal inlay. The silicide layer can be arranged at the inner sidewall of the silicon gate region, which faces away from the channel, or, in case of the silicon gate region deposited onto the metal inlay region, at the lower end of the silicon gate region. The silicide can be formed by letting diffuse metal atoms out of a thin layer deposited for that purpose ("silicide formation layer").

To form titanium silicide, the silicide formation layer can for instance be a titanium or titanium/titanium nitride layer, deposited for example by sputtering. In a subsequent thermal treatment, the silicide will form where the silicide formation layer is in contact with silicon (doped silicon or polysilicon). Therein, the titanium nitride barrier can be formed simultaneously by using a nitrogen or ammonia ambient. On an interlayer dielectric, as for instance oxide or nitride, no silicide is formed. However, the barrier layer can form there, in particular the titanium nitride barrier layer.

Preferably, the metal material filler in the contact trench comprises a silicide layer and is in electrical contact with the source region at or via this silicide layer. The metal material filler can also comprise a barrier layer, in particular titanium nitride, between the silicide layer and the bulk material of the metal material filler. Particularly preferred, this silicide layer of the metal material filler is of the same type, namely is made of the same material, and has the same thickness as the silicide layer of the gate electrode. The silicide layers of the gate electrode and the metal material filler are preferably formed in the same process step. Otherwise, if one silicide layer was formed earlier, it could be destroyed during the formation of another silicide layer later on.

To manufacture such a device, the silicide formation layers can be deposited into the metal inlay region trench and the vertical contact trench at the same time. Then, the silicide, and if applicable also the barrier layer(s), can be formed, typically prior to the deposition of the bulk metal of the metal material filler and the metal inlay region. Alternatively, the metal inlay region trench and the vertical contact trench can be etched and filled in different process steps, for instance the vertical contact trench after the metal inlay region trench. Therein, to obtain silicide layers of the same type and thickness, the silicide formation is performed later on, in a common process step. The silicide formation layers are deposited one after the other, but the silicide formation is done in the same step (after deposition of the last silicide formation layer). In general, however, the silicide layers of the metal material filler and the metal inlay might also have different thicknesses, though being of the same type.

In a preferred embodiment, a field plate region is arranged below the gate electrode in the vertical gate trench. It is electrically isolated from the gate electrode, for instance by silicon oxide. The field electrode is electrically connected to the source region and can prevent a capacitive coupling of the gate to the drift/drain region. Regarding details of manufacturing such a device, reference is made to U.S. Pat. No. 7,005,351 B2. Alternatively, the transistor could be a UMOS device, in particular with a thick dielectric below the gate electrode, for instance a thick bottom oxide in a range of 100-200 nm.

The invention also relates to a method for manufacturing a semiconductor transistor device, comprising the steps
  i.) etching the vertical gate trench;
  ii.) depositing the silicon gate material;
  iii.) etching through the silicon gate material;
  iv.) depositing the metal material.

Regarding manufacturing details, reference is also made to the description above.

The silicon region, into which the vertical gate trench is etched, is preferably epitaxial silicon grown on a substrate. It can be doped during the growth (in situ). For instance, for an n-channel device, an n-doped layer can be grown on an $n^+$-doped substrate, the latter forming the drain region and the former the drift region.

The vertical gate trench is etched after the epitaxial growth and extends into the epitaxial layer, namely into the drift region. There, a field electrode (field plate) can be formed in the gate trench, see U.S. Pat. No. 7,005,351 B2 in detail. In a subsequent step, an interlayer dielectric can be formed in the gate trench, for instance by deposition or in particular oxidation. Vertically, the interlayer dielectric can cover the field electrode formed before or, in case that no field electrode has been formed, a ground of the gate trench. In general, the gate dielectric (gate oxide) could be formed in the same step. In this case, the interlayer dielectric covering the field electrode (or ground of the gate trench) vertically would also form the gate oxide at the lateral wall of the gate trench.

Alternatively, the interlayer dielectric covering the field electrode (or ground of the gate trench) could be formed first, in particular by deposition, Then, after etching back the interlayer dielectric (recess etch), the gate oxide can be formed, in particular by oxidation.

In any case, subsequently, the silicon gate material can be deposited into the gate trench in step ii.). Thereafter, in particular, the silicon gate material can be etched back (to adjust a defined height of the silicon gate material in the gate trench or remove excess silicon from the surface of the wafer). The body and source region can be generated by for instance implanting a dopant and activating it by an anneal, in particular after etching back the silicon gate material. In this way, for instance a p-doped layer can be added for the body/channel region, and on top an n$^+$-doped layer for the source region. Independently of these details, at the end of step ii), the silicon gate material covers the interlayer dielectric, which is arranged below, in the vertical direction.

Additionally, after step ii.) and prior to step iii.), the gate trench is preferably filled up with an interlayer dielectric, which covers the silicon gate material then. A contact lithography etch can be performed through the interlayer dielectric, for instance by using a patterned hard mask or photo resist layer. In a first etch step, the interlayer dielectric above the silicon gate material will be etched through, the etch chemistry can stop automatically on the silicon gate material. For etching through the latter (e.g. polysilicon) in step iii.), another etch chemistry can be employed. When etching through the silicon gate material, the interlayer dielectric above, which has been etched in the first step, can act as a hard mask.

In a sectional view, when the silicon gate material is etched back in step iii.), a vertical hole is etched through the silicon gate material down to the interlayer dielectric (see the remarks on the symmetric design). Depending on the design in detail, the etch chemistry can be changed again to etch even deeper (additional optional over etch), namely into the interlayer dielectric below the silicon gate material, for fabricating a gate electrode with a stepped shape.

In step iv.), the metal material is deposited to form the metal inlay region. It covers the interlayer dielectric below, which has been uncovered in step iii), and it also covers the inner sidewall of the silicon gate region. In other words, the hole etched through the silicon gate region is filled up by metal. In particular, the metal material deposition can comprise the following steps (in the sequence mentioned):
   a.) titanium/titanium nitride deposition+silicide anneal (now or later on, see the remarks above);
   b.) tungsten deposition, in particular by CVD;
   c.) removal of excess tungsten from the wafer surface, for instance by chemical mechanical polishing (CMP) stopping on the interlayer dielectric.

For contacting the body/source region, a metal material filler can be formed in a contact trench. In particular, the metal material filler of the contact trench can extend further upwards than the metal inlay region of the gate electrode (see the description above). For manufacturing such a device, the metal (e.g. tungsten) deposited into the gate trench can be etched back, for instance after step c.) above. When etching back the tungsten, the metal material filler in the contact trench can be protected, for instance by a photo resist layer. After etching back, the resulting recess in the gate trench can be filled up by an interlayer dielectric, in particular oxide. Then, the frontside can be planarized by CMP, the upper end of the metal material filler in the contact trench is exposed and can be contacted by depositing the frontside metallization.

In a preferred embodiment, the vertical contact trench extending into the source region is etched simultaneously in step iii.). Later on, the contact trench will be filled by the material filler, as described above. For the simultaneous etching of the trenches, the thickness of the silicon gate material prior to step iii.) is preferably chosen such that the etching through the silicon gate material in the gate trench stops on the underlying dielectric prior to completing the etching of the vertical contact trench. The etching of the silicon gate material stops automatically on the interlayer dielectric below, and the contact trench can be etched further, until a desired depth for the optimum performance is reached. It extends into, but not through the body region. This enables a very stable processing.

BRIEF DESCRIPTION OF THE DRAWINGS

Below, the invention is explained in further detail by means of exemplary embodiments. Therein, the individual features can also be relevant for the invention in a different combination.

DETAILED DESCRIPTION

Figure 1:
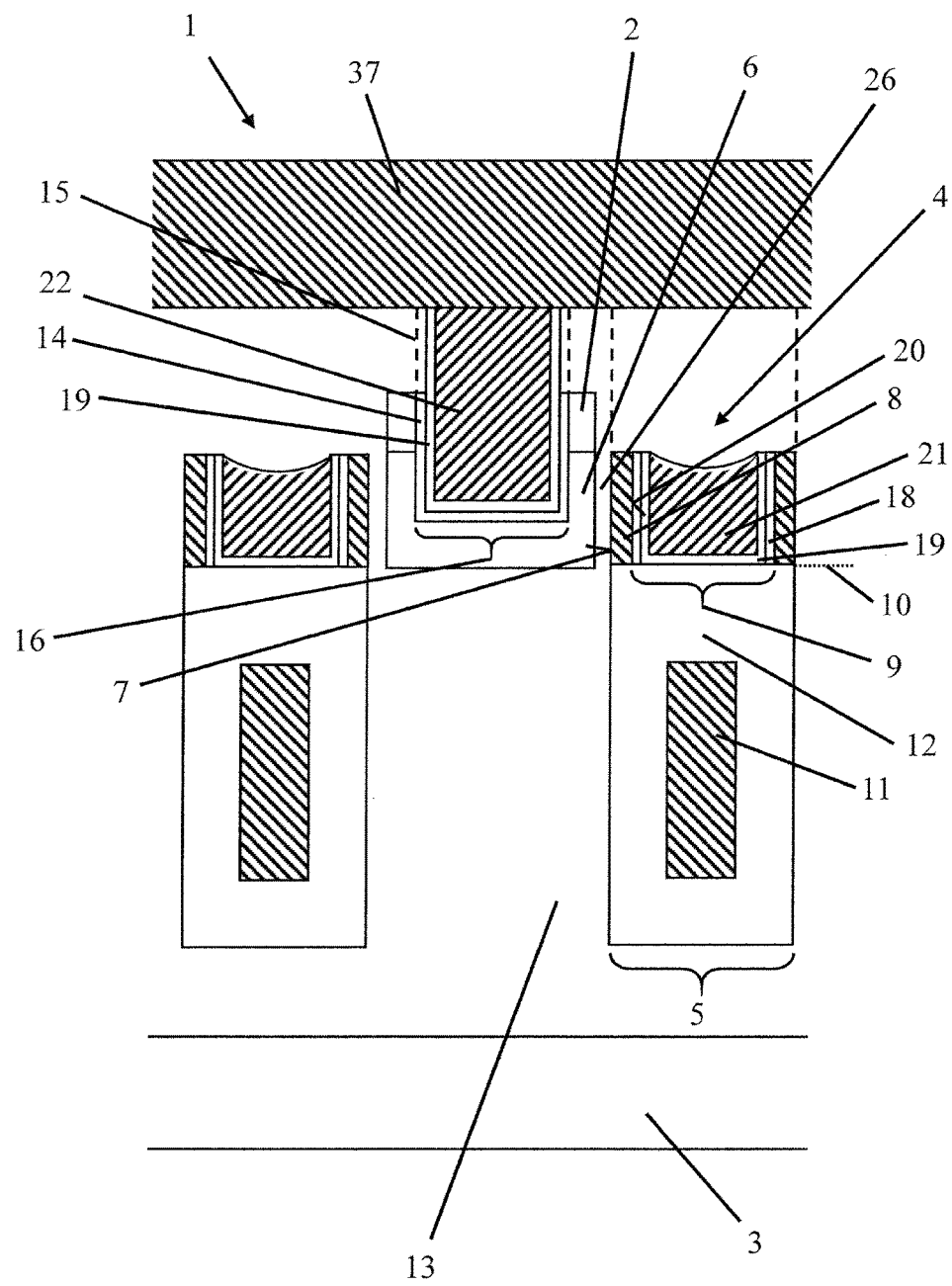
FIG. 1 shows a transistor device according to the invention in a sectional view.

FIG. 1 shows a semiconductor transistor device 1 according to the invention, comprising a source region 2 and a drain region 3. By a gate electrode 4 placed in a vertical gate trench 5, the current flow in a channel region 6 can be controlled. The channel region 6 extends vertically between the source region 2 and the drain region 3 (through the body region). It lies laterally aside a gate dielectric 26 (e. g. gate oxide), which is arranged laterally aside the gate electrode 4, namely in between a sidewall 7 of the gate electrode 4 and the channel region 6. The channel region 6 extends vertically along the gate dielectric 26.

The gate electrode 4 comprises a silicon gate region 8, which is for example made of n-doped polysilicon. Additionally, it comprises a metal inlay region 9. The metal inlay region 9 can for example comprise tungsten as a bulk material 21. The inclusion of the metal reduces the resistance $R_G$ of the gate electrode 4, which can enhance the gate signal propagation across the device 1. As the metal inlay region 9 extends down to a lower end 10 of the gate electrode 4, the cross-section of the metal can be maximized Since the sidewall 7 of the gate electrode 4 is formed by polysilicon, the threshold voltage is kept low (in comparison to a metal gate).

Below the gate electrode 4, a field electrode 11 is arranged in the gate trench 5. Above the field electrode 11, an interlayer dielectric 12 is formed, on which the gate electrode 4 is fabricated, as explained in further detail by means of FIG. 2.

The transistor device 1 shown here is a power device with a lightly doped drift region 13 in between the highly doped drain region 3 and the channel region 6. The bottom of the channel region 6 exits into the drift region 13. The drift region 13 is epitaxially grown, the channel region 6 and the source region 2 are formed by ion implantation into this epitaxial layer. In case of the NMOS device shown here, the drain region 3 and the source region 2 are highly n-doped, the channel region 6 is p-doped, and the drift region 13 is lightly n-doped. After the epitaxial growth, the vertical gate trench 5 is etched into the silicon, using a hard mask (TEOS), see in detail U.S. Pat. No. 7,005,351 B2.

Figure 2A:
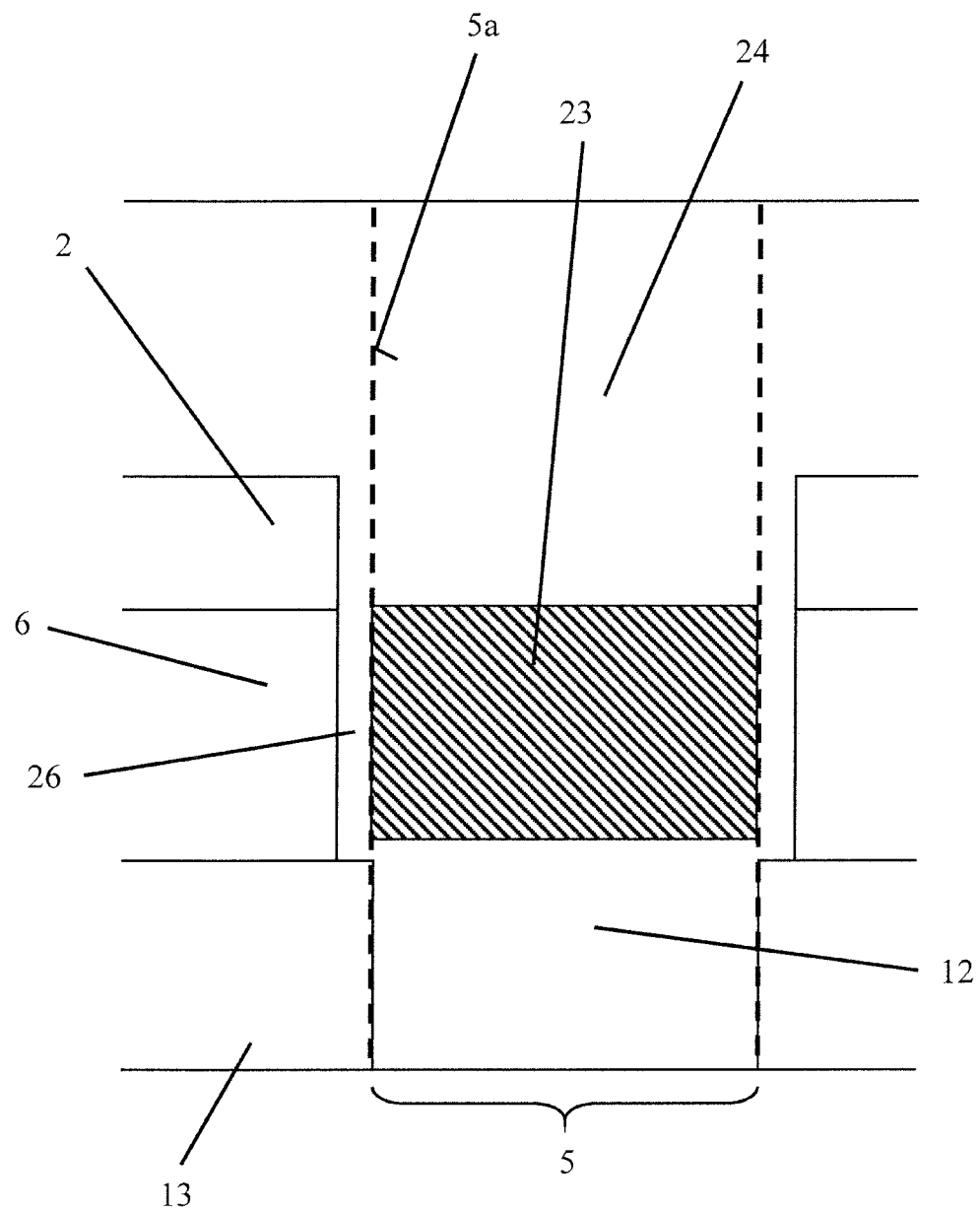
FIGS. 2*a*-2*c* illustrate different stages of manufacturing the transistor device of FIG. 1.

The source region 2 is electrically contacted by a metal material filler 16 arranged in a vertical contact trench 15. Like the metal inlay region 9, it can comprise tungsten as a bulk material 22. Further, it can comprise a silicide layer 14, so that the electrical contact to the source region 2 and the body region with the channel region 6 can be made via this silicide layer 14. Optionally, also in the gate electrode 4, the metal inlay region 9 and the silicon gate region 8 can be electrically connected via a silicide layer 18 of the metal inlay region 9. The numerals 19 reference optional barrier layers of the metal material filler 16 and the metal inlay region 9. They can for instance be made of titanium and/or titanium nitride, which can have been deposited before for the silicide formation (silicide formation layer). Afterwards, the titanium could be removed. When it remains in the gate trench 5, it is considered as a part of the metal inlay region 9, FIG. 2a illustrates the gate trench 5 and a sidewall 5a thereof in a detailed view prior to etching through the silicon gate material to form the silicon gate region 8. In the processing stage shown here, the silicon gate material, which is polysilicon 23, covers the interlayer dielectric 12 vertically and the gate dielectric 26 laterally. On top of the polysilicon 23, the gate trench 5 is filled up with an interlayer dielectric 24. Regarding the manufacturing of the structure shown in FIG. 2a, reference is made to the description above and also to U.S. Pat. No. 7,005,351 B2.

Figure 2B:
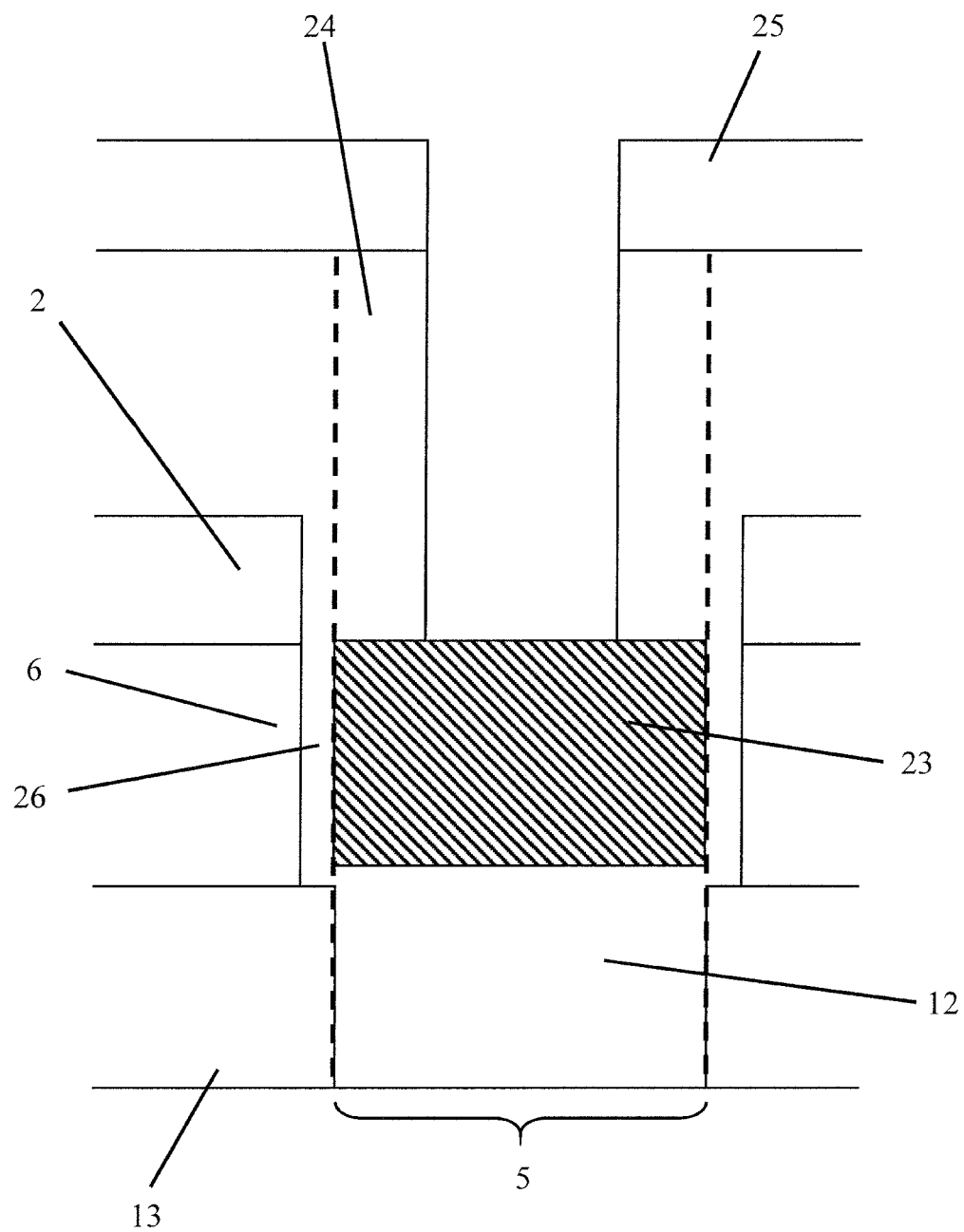
Figure 2C:
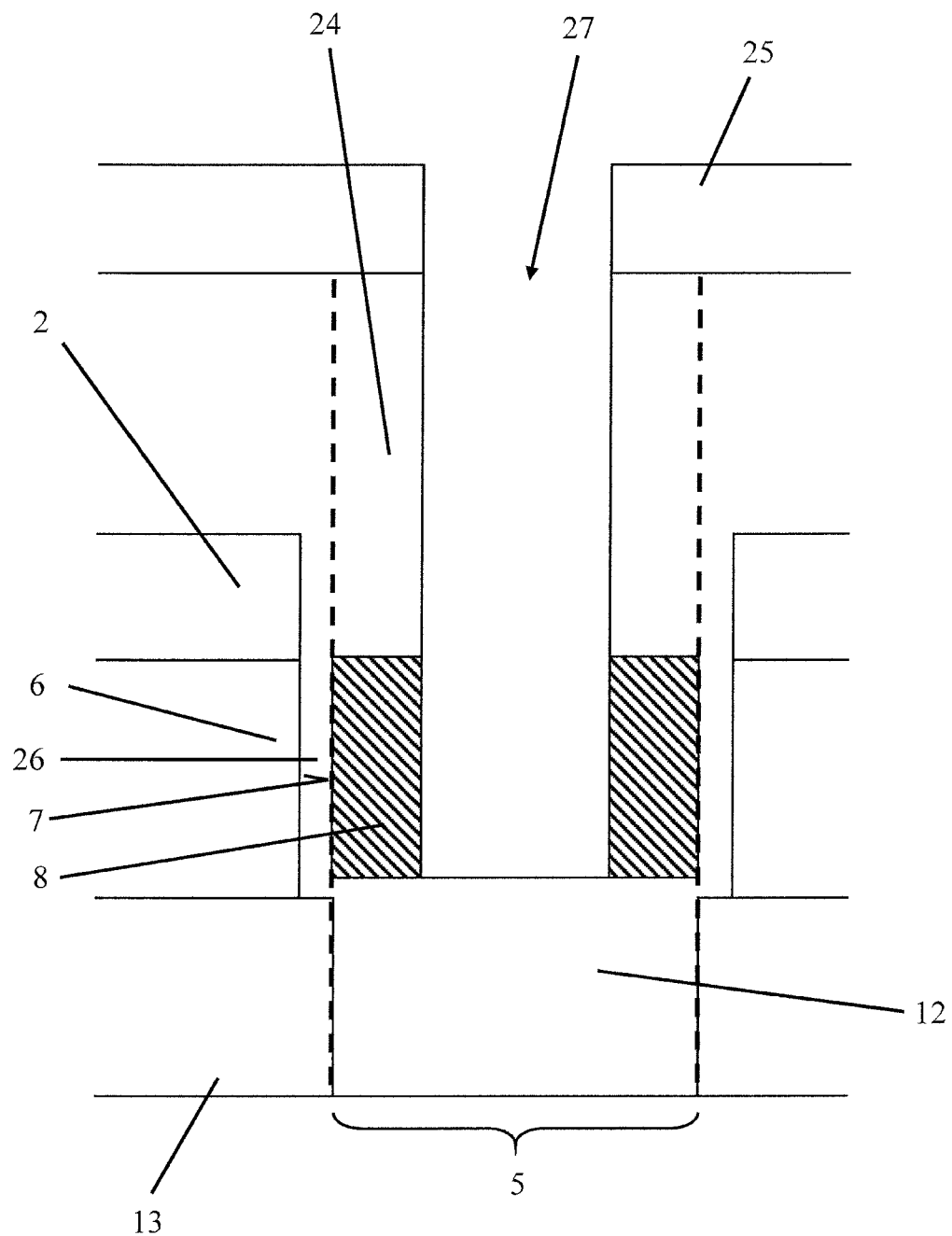

For etching through the interlayer dielectric 24 and the polysilicon 23, a mask 25 is used, for instance a patterned hard mask or photo resist layer, see FIG. 2b. The etch chemistry for the interlayer dielectric 24, typically silicon dioxide, stops automatically on the polysilicon 23. Then, the etch chemistry is changed and a hole is etched through the polysilicon 23 to form the silicon gate region 8, as shown in FIG. 2c. Subsequently, for instance a layer of titanium or titanium and titanium nitride can be deposited for the silicide formation. Then the tungsten is deposited.

Apart from the manufacturing details, FIGS. 2a-c give a detailed view of the gate dielectric 26 formed laterally in between the sidewall 7 of the gate electrode 4 and the channel region 6.

To manufacture the device shown in FIG. 1, the metal inlay region 9 and the metal material filler 16 in the contact trench 15 are preferably deposited at the same time. Therein, the metal inlay region trench 27 (see FIG. 2c) is filled up completely by the tungsten material. To obtain the structure of FIG. 1, the tungsten is etched back thereafter. Before, a photoresist can be deposited and structured to protect the metal material filler 16 during etching.

Figure 3A:
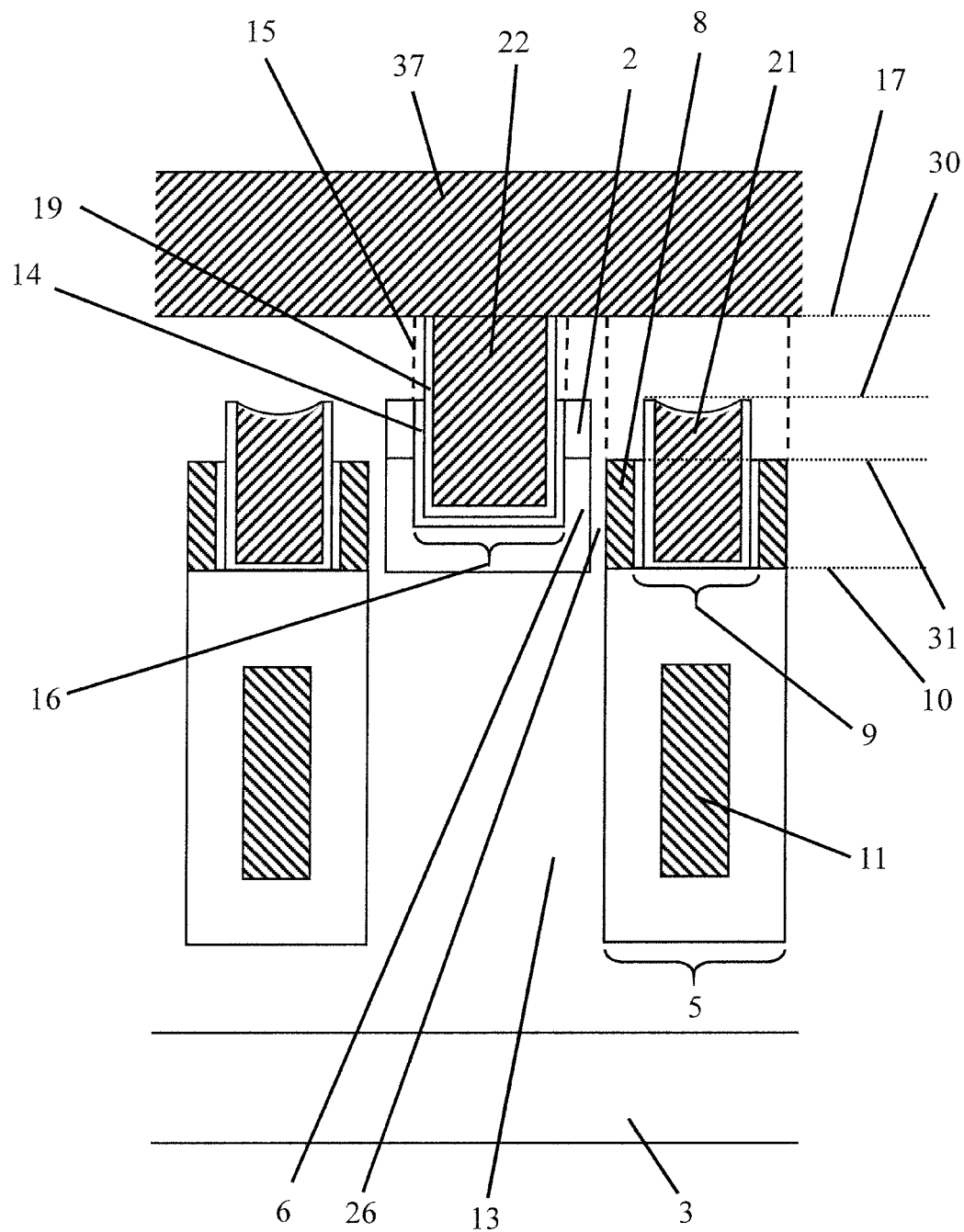
FIGS. 3*a*-3*b* show alternative transistor devices according to the invention in sectional views.

The metal inlay region 9 can be etched back to a level shown in FIG. 1, so that the inner sidewall 20 of the silicon gate region 8 is covered, but the metal inlay region 9 does not project above. Alternatively, an upper end 30 of the metal inlay region 9 can lie slightly above an upper end 31 of the silicon gate region 8, as shown in FIG. 3a. Likewise, the cross-section of the metal inlay region 9 can be increased, which reduces $R_G$.

Figure 3B:
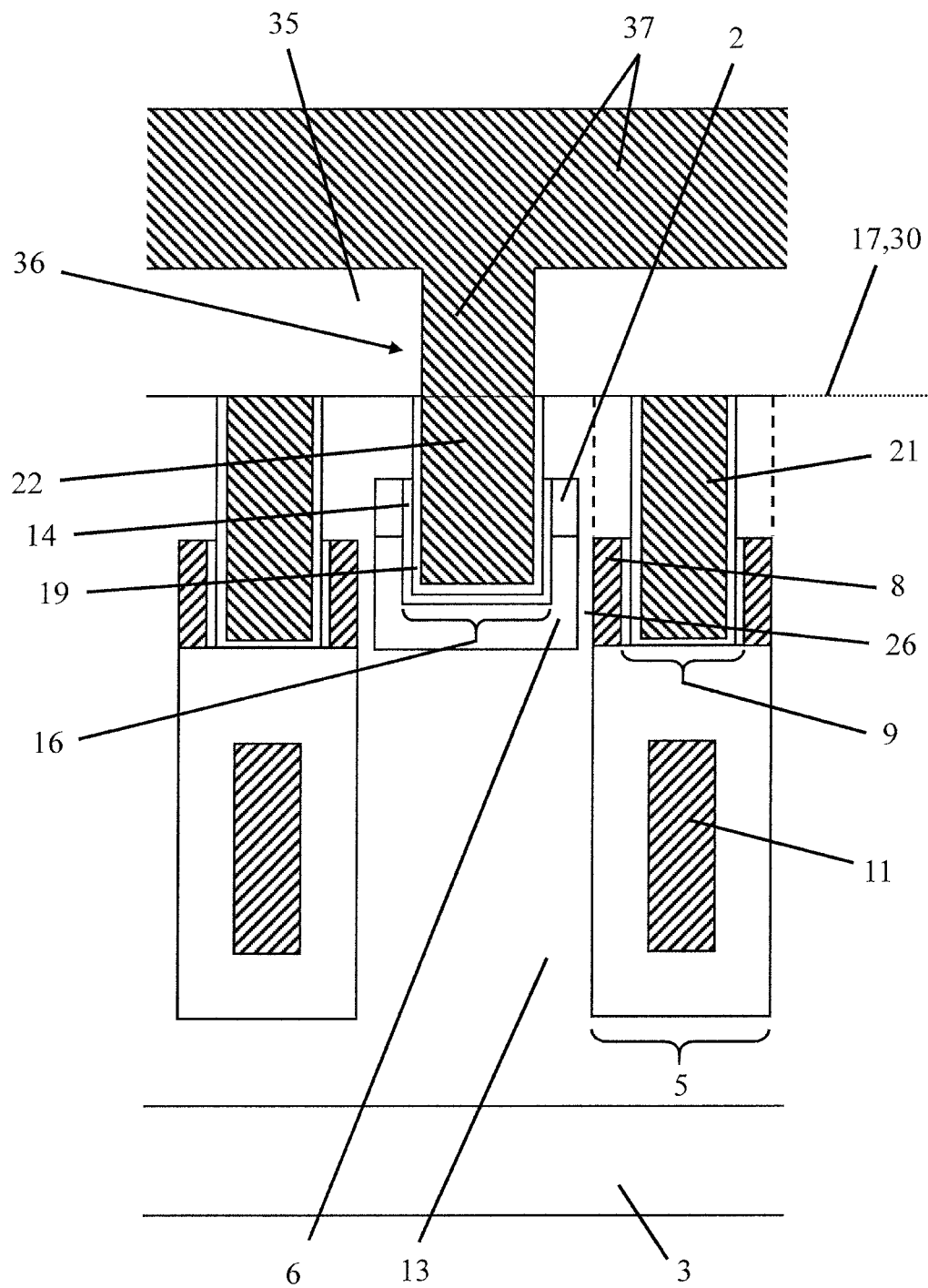

In this respect, the embodiment shown in FIG. 3b can be advantageous. The metal inlay region 9 is not etched back at all, its upper end 30 lies on the same height as the upper end 17 of the metal material filler 16. For manufacturing this structure, an interlayer dielectric 35 is deposited after forming the metal inlay region 9 and the metal material filler 16, namely a low temperature dielectric to not impair the silicide formed before. Then, a vertical interconnect 36 is etched into the interlayer dielectric 35, and the metallization 37 is deposited for the source contact. The design shown in FIG. 3b lowers $R_G$ but can cause a capacitive coupling between the metal material filler 16 and the metal inlay region 9.

Figure 4:
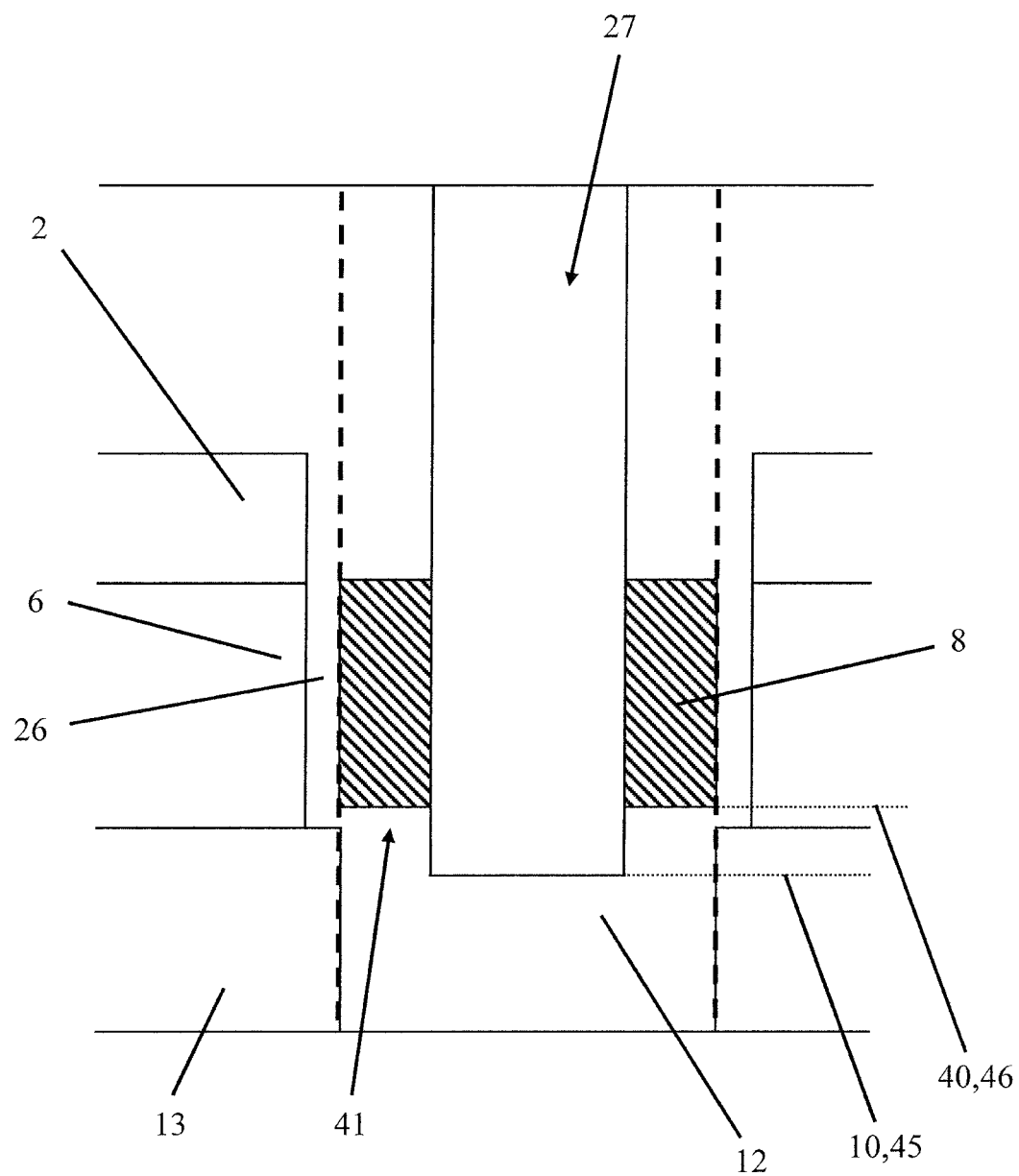
FIG. 4 illustrates the manufacturing of a transistor device with a metal inlay region having an increased cross-section, starting from the processing stage shown in FIG. 2*c*.

FIG. 4 illustrates an alternative approach to increase the cross-section of the metal inlay region 9. Following on the process step shown in FIG. 2c, an additional anisotropic dielectric etch is applied to deepen the metal inlay region trench 27 further. After etching through the silicon gate material (e.g. polysilicon), the etch chemistry is changed to etch the interlayer dielectric 12. Then, after for instance a titanium or titanium and titanium nitride deposition for the silicide, the bulk material 21, for instance tungsten, is deposited to complete the metal inlay region 9. In this case, the lower end 45 of the metal inlay region 9 lies below a lower end 46 of the silicon gate region 8, the gate electrode 4 is formed with a step 41.

Figure 5:
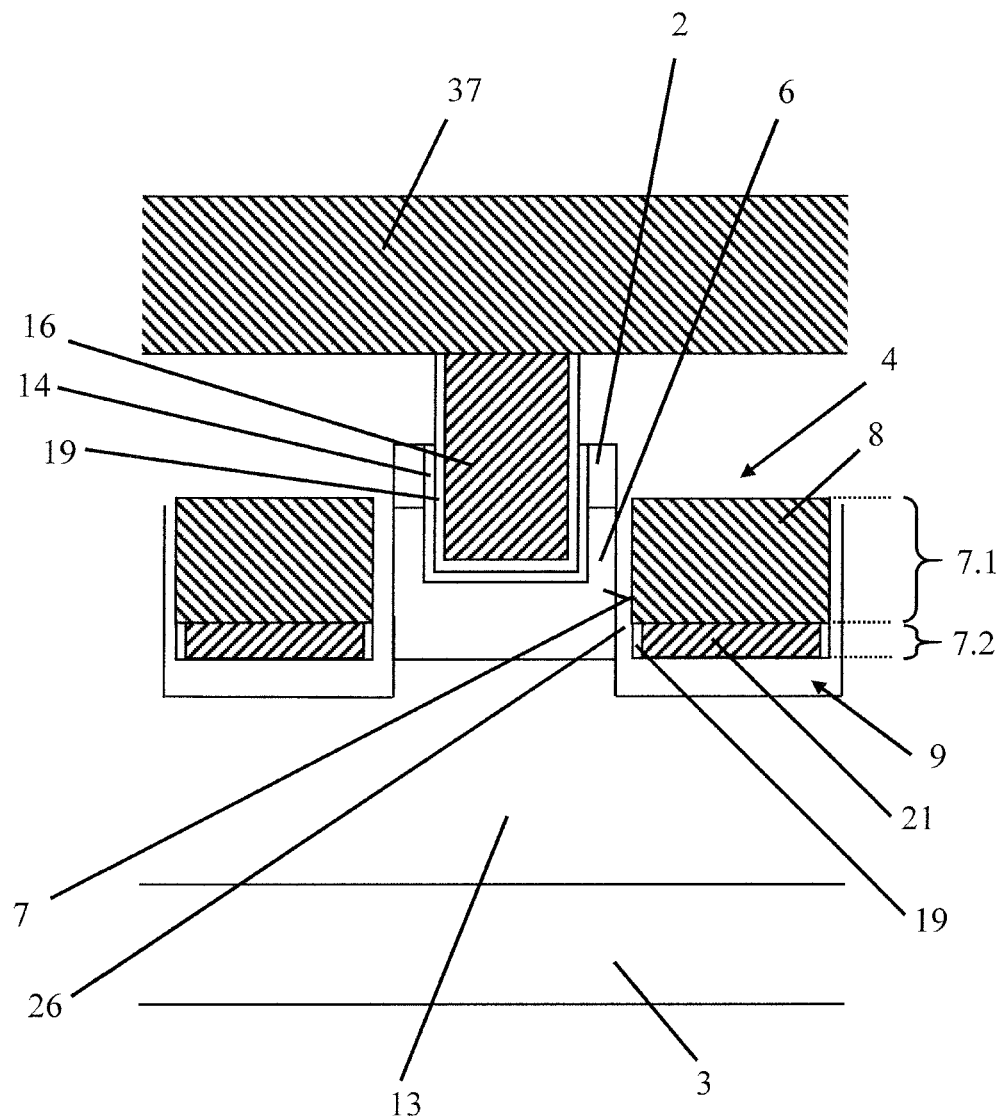
FIG. 5 shows a further transistor device according to the invention in a sectional view.

FIG. 5 shows a transistor device 1 with an alternative design of the gate electrode 4. Regarding the setup of the source region 2, the channel region 6, the drift region 13 and the drain region 3, the device 1 is comparable to the embodiments discussed above, the same applies for the metal material filler 16 and the metallization 37. However, in contrast to the embodiments above, the silicon gate region 8 forms only an upper section 7.1 of the sidewall 7 of the gate electrode 4. A lower section 7.2 of the sidewall 7 is formed by the metal inlay region 9. In the upper section 7.1, the threshold voltage remains unchanged compared to a conventional polysilicon gate. In the lower section 7.2 however, the threshold voltage is increased due to the metal-silicon work function difference. This design takes advantage of the local increase of the threshold voltage in the lower section 7.2 close to the drain region 3 to counteract drain induced barrier lowering.

Figure 6:
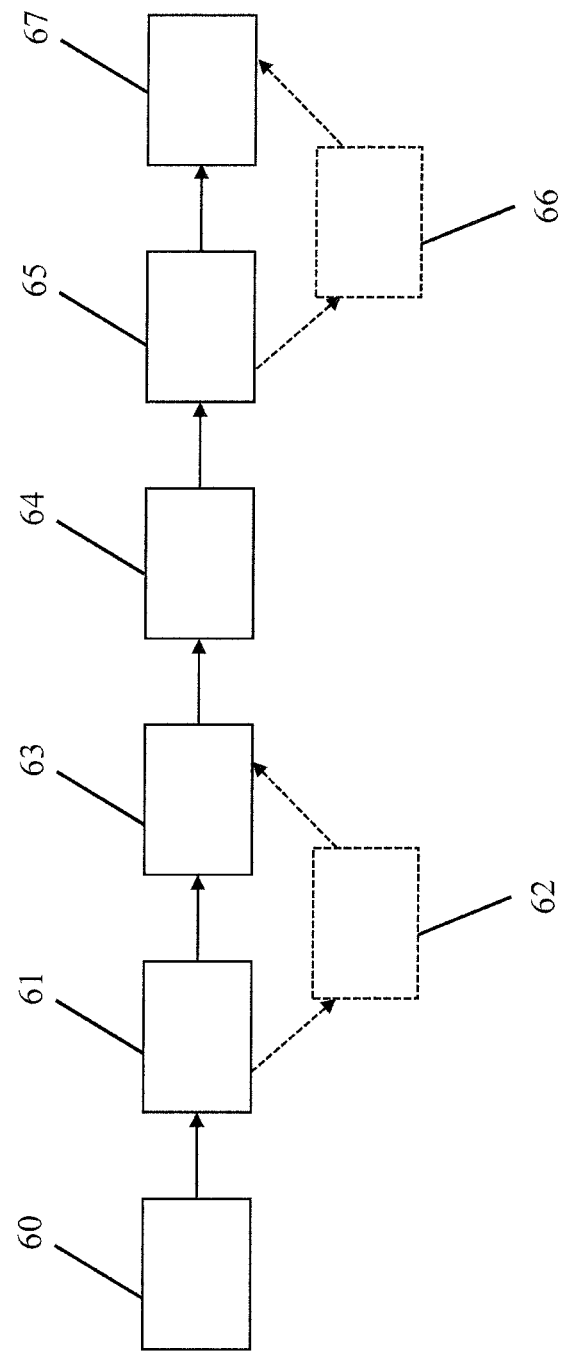
FIG. 6 illustrates the manufacturing of a transistor device according to the invention in a block diagram.

FIG. 6 summarizes some of the manufacturing steps discussed above. After epitaxially growing 60 the layer for the drift region 13, the vertical gate trench 5 is formed by etching 61. Optionally, the field plate region 11 can be formed by depositing 62 field plate material into the vertical gate trench 5 (see in detail U.S. Pat. No. 7,005,351 B2). After forming 63 the interlayer dielectric 12 in the vertical gate trench 5, a preform of the silicon gate region 8 is formed by depositing 64 the silicon gate material into the vertical gate trench 5 (before, the gate dielectric 26 has been grown or deposited). By etching through 65 the silicon gate material, the dielectric 12 is uncovered and the silicon gate region 8 is formed. Optionally, the metal inlay region trench 27 can be deepened by etching 66 into the interlayer dielectric 12 below. Finally, the metal inlay region 9 is formed by depositing 67 the metal material into the vertical gate trench 5.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a semiconductor transistor device, the method comprising:
   etching a vertical gate trench into a silicon region;

depositing a silicon gate material on an interlayer dielectric formed in the vertical gate trench so that an upper side of the interlayer dielectric is covered;

etching through the silicon gate material in the vertical gate trench to partly uncover the upper side of the interlayer dielectric and so that a silicon gate region of a gate electrode of the semiconductor transistor device remains in the vertical gate trench;

etching a vertical contact trench into a source region of the semiconductor transistor device; and depositing a metal material into the vertical gate trench so that the partly uncovered upper side of the interlayer dielectric is covered by the metal material, wherein the vertical contact trench is etched simultaneously as the etching through of the silicon gate material.

2. The method of claim 1, further comprising:

filling the vertical contact trench with a metal material filler, wherein an upper end of the metal material filler lies vertically above an upper end of a metal inlay region of the gate electrode.

3. The method of claim 2, and wherein a thickness which the silicon gate material has prior to the etching through of the silicon gate material is chosen such that the upper side of the interlayer dielectric is uncovered by the etching through of the silicon gate material before the vertical contact trench has been etched to a final depth.

4. The method of claim 1, wherein the silicon gate material has a uniform width in the vertical gate trench.

5. The method of claim 1, further comprising forming a field electrode in the gate trench, and wherein the interlayer dielectric is formed to cover the field electrode.

6. The method of claim 1, wherein the gate electrode is formed to comprise a silicon gate region made of the silicon gate material and a metal inlay region made of the metal material, wherein the silicon gate region forms at least a section of the sidewall of the gate electrode, wherein the metal inlay region extends up from a lower end of the gate electrode, and wherein the silicon gate region forms an upper section of the sidewall of the gate electrode, and wherein the metal inlay region forms a lower section of the sidewall of the gate electrode.

7. The method of claim 1, wherein the gate electrode is formed to comprise a silicon gate region made of the silicon gate material and a metal inlay region made of a metal material, wherein the silicon gate region forms at least a section of the sidewall of the gate electrode, wherein the metal inlay region extends up from a lower end of the gate electrode, and wherein the metal inlay region comprises a silicide layer which is arranged adjacent to the silicon gate region, so that the metal inlay region is electrically connected to the silicon gate region via the silicide layer.

8. A method for manufacturing a semiconductor transistor device, the method comprising:

etching a vertical gate trench into a silicon region;

depositing a silicon gate material on a first interlayer dielectric formed in the vertical gate trench so that an upper side of the first interlayer dielectric is covered;

depositing a second interlayer dielectric on an upper side of the silicon gate material in the vertical trench;

etching through a portion of the second interlayer dielectric in the vertical trench to partly uncover the upper side of the silicon gate material;

etching through the partly uncovered upper side of the silicon gate material in the vertical gate trench to partly uncover the upper side of the interlayer dielectric so that a silicon gate region of a gate electrode of the semiconductor transistor device remains in the vertical gate trench; and depositing a metal material into the vertical gate trench so that the partly uncovered upper side of the interlayer dielectric is covered by the metal material.

9. The method of claim 8, further comprising:

etching a vertical contact trench into a source region of the semiconductor transistor device; and filling the vertical contact trench with a metal material filler, wherein an upper end of the metal material filler lies vertically above an upper end of a metal inlay region of the gate electrode.

10. The method of claim 9, wherein the vertical contact trench is etched simultaneously as the etching through of the silicon gate material, and wherein a thickness which the silicon gate material has prior to the etching through of the silicon gate material is chosen such that the upper side of the interlayer dielectric is uncovered by the etching through of the silicon gate material before the vertical contact trench has been etched to a final depth.

* * * * *